(12) United States Patent
Han

(10) Patent No.: US 10,249,698 B2
(45) Date of Patent: Apr. 2, 2019

(54) TRANSPARENT OLED DISPLAY PANEL

(71) Applicant: Shenzhen China Star Optoelectronics Technology Co., Ltd., Shenzhen (CN)

(72) Inventor: Baixiang Han, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/509,198

(22) PCT Filed: Feb. 16, 2017

(86) PCT No.: PCT/CN2017/073726
§ 371 (c)(1),
(2) Date: Mar. 7, 2017

(87) PCT Pub. No.: WO2018/133145
PCT Pub. Date: Jul. 26, 2018

(65) Prior Publication Data
US 2018/0233550 A1      Aug. 16, 2018

(30) Foreign Application Priority Data
Jan. 19, 2017   (CN) .......................... 2017 1 0038290

(51) Int. Cl.
*H01L 27/32*      (2006.01)

(52) U.S. Cl.
CPC ...... *H01L 27/3276* (2013.01); *H01L 27/3211* (2013.01)

(58) Field of Classification Search
CPC ........ H01L 27/3237–27/3297; H01L 27/3276; H01L 27/3211; H01L 51/56
See application file for complete search history.

(56) References Cited

U.S. PATENT DOCUMENTS

| | | | |
|---|---|---|---|
| 9,734,755 B2 * | 8/2017 | Lee ...................... | G09G 3/3275 |
| 2012/0026144 A1 * | 2/2012 | Kang ................... | G09G 3/3225 345/211 |
| 2012/0153321 A1 * | 6/2012 | Chung ................ | H01L 27/3276 257/91 |
| 2012/0169683 A1 * | 7/2012 | Hong .................. | H01L 27/3211 345/206 |
| 2016/0043154 A1 * | 2/2016 | Choi .................... | H01L 27/3258 257/40 |

* cited by examiner

*Primary Examiner* — Changhyun Yi
(74) *Attorney, Agent, or Firm* — Leong C. Lei

(57) ABSTRACT

The present application provides a transparent OLED display panel. By providing the second power supply line and the first data line in the transparent region of the transparent OLED display panel in the first metal layer and the second metal layer, respectively and makes the two insulating layer arranged in a stacking manner, and the second data line and the third data line are respectively provided in the first metal layer and the second metal layer and makes the two insulating layer arranged in a stacking manner, compared to the interval arrangement in the conventional technology, the area of the traces of the transparent region of the transparent OLED display panel can be greatly reduced, the transmittance of the transparent OLED display panel is enhanced and to facilitate the development of the high resolution transparent OLED display panel.

16 Claims, 5 Drawing Sheets

TRANSPARENT OLED DISPLAY PANEL

FIELD OF THE INVENTION

The present application relates to a display technology field, and more particularly to a transparent OLED display panel.

BACKGROUND OF THE INVENTION

With the development of display technology, a variety of new technologies continue to emerge, transparent display technology because of its feature of transparent display panel and its unique application, has more and more people's attention.

A transparent display apparatus generally refers to a display that can form a transparent display state so that the viewer can see the image displayed in the display and the scene behind the display apparatus. Transparent display apparatus have many possible applications, such as windows for buildings or cars and shopping windows for shopping malls. In addition to the application of these large devices, small devices such as handheld tablet PCs can also benefit from transparent display apparatus, such as enabling users to view the map and be able to view the front scene through the display.

It is expected that most of the existing display market will be gradually replaced by transparent display, such as in the fields of architecture, advertising and public information. The transparent display is divided into a head-up display, a transparent liquid crystal display, LCD and a transparent organic light-emitting diode, OLED. In these transparent displays, the head-up display is realized by image projection, and transparent liquid crystal display and transparent OLED display is a true sense of the transparent display. And compared to the LCD display, its own characteristics of OLED display makes it more suitable for the production of transparent display.

As shown in FIG. 1, a transparent OLED display in the conventional technology includes a plurality of display pixels 100 and a plurality of transparent regions 200, the plurality of display pixels 100 arranged in an array type, one transparent region 200 is provided between each of the two adjacent columns of the display pixels 100, a second power supply line 300 is provided corresponding to each column of the display pixels 100, a scanning line 400 and a first power supply line 500 are provided corresponding to each row of display pixels 100; and each of the display pixels 100 includes red, green, and the blue sub-pixels 101, 102, 103 arranged sequentially along the column direction. A red data line 501 is provided corresponding to each column of the red sub-pixels 101, a green data line 502 is provided corresponding to each column of the green sub-pixels 102, a blue data line 503 is provided corresponding to each column of the blue sub-pixels 103, the second power supply line 300, the red data line 501, the green data line 502, and the blue data line 503 are located on the same layer and are arranged space apart from each other, and all of them extend downwards and need to be pass through the transparent region 200, resulting in excessive formation of the metal lines in the transparent region 200, making a decrease in the transmittance of the transparent region 200, and affecting the transmission effect.

SUMMARY OF THE INVENTION

The object of the present application is to provide a transparent OLED display panel which can reduce the area of the traces of the transparent region of the transparent OLED display panel and enhance the transmittance of the transparent OLED display panel to facilitate the development of the high resolution transparent OLED display panel.

In order to achieve the above object, the present application provides a transparent OLED display panel including: a plurality of display pixels arranged in an array type, each of the plurality of display pixels including a display region and a transparent region sequentially arranged along a vertical direction, each display region including a first, a second, and a third sub-pixels sequentially arranged along the horizontal direction;

a horizontal scanning line and a horizontal first power supply line electrically connected to a row of the display pixel is provided corresponding to each row of the display pixel, a vertical second power supply line electrically connected to the first power supply line is provided corresponding to each column of the display pixel, a first data line electrically connected to the first sub-pixel is provided corresponding to each column of the first sub-pixel, a second data line electrically connected to the second sub-pixel is provided corresponding to each column of the second sub-pixel, a third data line electrically connected to the third sub-pixel is provided corresponding to each column of the third sub-pixel;

the first power supply line and the scanning line are located in the first metal layer, the first data line and the second data line are located in the second metal layer stacked above the first metal layer, an insulating layer is provided between the first metal layer and the second metal layer;

the second power supply line including: a first extension portion and a first bridge portion, the first extension portion is located in the first metal layer, the first bridge portion is located in the second metal layer, the first bridge portion is electrically connected to the first extension portion through a first via hole in the insulating layer, and the second power supply line is insulated from and cross the scanning line by the first bridge portion; the third data line including a second extension portion and a second bridge portion, the second extension portion is located in the first metal layer, the second bridge portion is located in the second metal layer, the second bridge portion is electrically connected to the second extension portion through a second via hole in the insulating layer, and the third data line is insulated from and cross the first power supply line by the second bridge portion and the scanning line; and in the transparent region, the first data line is insulated and stacked to the second power supply line, and the second data line is insulated and stacked to the third data line.

The first, second, and third sub-pixels are red, green, and blue sub-pixels, respectively.

Each of the sub-pixels including a first thin film transistor, a second thin film transistor, a capacitor, and an organic light emitting diode;

the gate of the first thin film transistor is electrically connected to the scanning line, the source is electrically connected to the data line corresponding to the sub-pixel, the drain is electrically connected to the gate of the second thin film transistor and one end of the capacitor; the drain of the second thin film transistor is electrically connected to the first power supply line corresponding to the sub-pixel, the source is electrically connected to an anode of the organic light emitting diode; the anode of the organic light emitting diode is electrically connected to the other end of the capacitive, and a cathode is grounded.

The gate of the first thin film transistor, the gate of the second thin film transistor, and the one end of the capacitor are located in the first metal layer, the source and the drain of the first thin film transistor, the source and the drain of the second thin film transistor, and the other end of the capacitor are located in the second metal layer.

The insulating layer including a gate insulating layer and an interlayer insulating layer; and an active layer is provided on the gate insulating layer corresponding to the positions of the gate of the first thin film transistor and the gate of the second thin film transistor, and the interlayer insulating layer covers the active layer and the gate insulating layer.

The source and drain of the first thin film transistor and the source and the drain of the second thin film transistor are in contact with both ends of the corresponding active layer through the two third via holes, respectively.

The materials of the first metal layer and the second metal layer are both of one or a combination of Aluminum, Molybdenum, and Titanium.

The material of the insulating layer is one or the combination of Silicon Oxide and Silicon Nitride.

The first data line and the second power supply line are located on the left edge side of the display pixel, the second data line and the third data line are located on the right edge side of the display pixel.

The present application further provides a transparent OLED display panel, including: a plurality of display pixels arranged in an array type, each of the plurality of display pixels including a display region and a transparent region sequentially arranged along a vertical direction, each display region including a first, a second, and a third sub-pixels sequentially arranged along the horizontal direction;

a horizontal scanning line and a horizontal first power supply line electrically connected to a row of the display pixel is provided corresponding to each row of the display pixel, a vertical second power supply line electrically connected to the first power supply line is provided corresponding to each column of the display pixel, a first data line electrically connected to the first sub-pixel is provided corresponding to each column of the first sub-pixel, a second data line electrically connected to the second sub-pixel is provided corresponding to each column of the second sub-pixel, a third data line electrically connected to the third sub-pixel is provided corresponding to each column of the third sub-pixel;

the first power supply line and the scanning line are located in the first metal layer, the first data line and the second data line are located in the second metal layer stacked above the first metal layer, an insulating layer is provided between the first metal layer and the second metal layer;

the second power supply line including: a first extension portion and a first bridge portion, the first extension portion is located in the first metal layer, the first bridge portion is located in the second metal layer, the first bridge portion is electrically connected to the first extension portion through a first via hole in the insulating layer, and the second power supply line is insulated from and cross the scanning line by the first bridge portion; the third data line including a second extension portion and a second bridge portion, the second extension portion is located in the first metal layer, the second bridge portion is located in the second metal layer, the second bridge portion is electrically connected to the second extension portion through a second via hole in the insulating layer, and the third data line is insulated from and cross the first power supply line by the second bridge portion and the scanning line;

in the transparent region, the first data line is insulated and stacked to the second power supply line, and the second data line is insulated and stacked to the third data line.

wherein the first, second, and third sub-pixels are red, green, and blue sub-pixels, respectively;

wherein each of the sub-pixels including a first thin film transistor, a second thin film transistor, a capacitor, and an organic light emitting diode;

the gate of the first thin film transistor is electrically connected to the scanning line, the source is electrically connected to the data line corresponding to the sub-pixel, the drain is electrically connected to the gate of the second thin film transistor and one end of the capacitor; the drain of the second thin film transistor is electrically connected to the first power supply line corresponding to the sub-pixel, the source is electrically connected to an anode of the organic light emitting diode; the anode of the organic light emitting diode is electrically connected to the other end of the capacitive, and a cathode is grounded.

The advantageous Effects of the present application: the present application provides a transparent OLED display panel, by providing the second power supply line and the first data line in the transparent region of the transparent OLED display panel in the first metal layer and the second metal layer, respectively, so that the two are insulated and arranged in a stacking manner, and the second data line and the third data line are respectively provided in the first metal layer and the second metal layer so that the two are insulated and arranged in a stacking manner, which the area of the traces of the transparent region of the transparent OLED display panel can be greatly reduced compared to the interval arrangement in the conventional technology, the transmittance of the transparent OLED display panel is enhanced and to facilitate the development of the high resolution transparent OLED display panel.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

Figure 1:
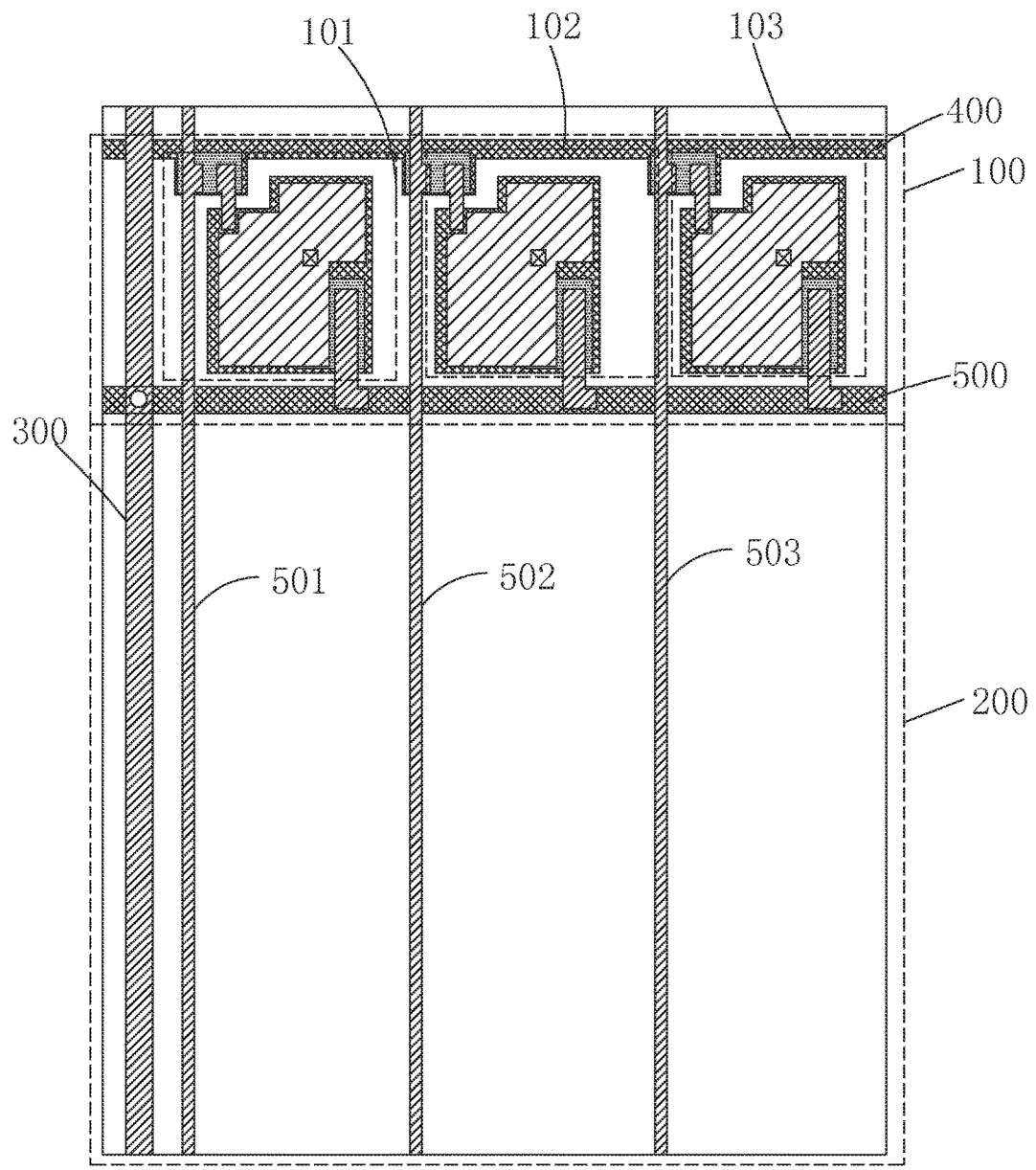
FIG. 1 is a schematic structural view of a transparent OLED display panel in the conventional technology.
Figure 2:
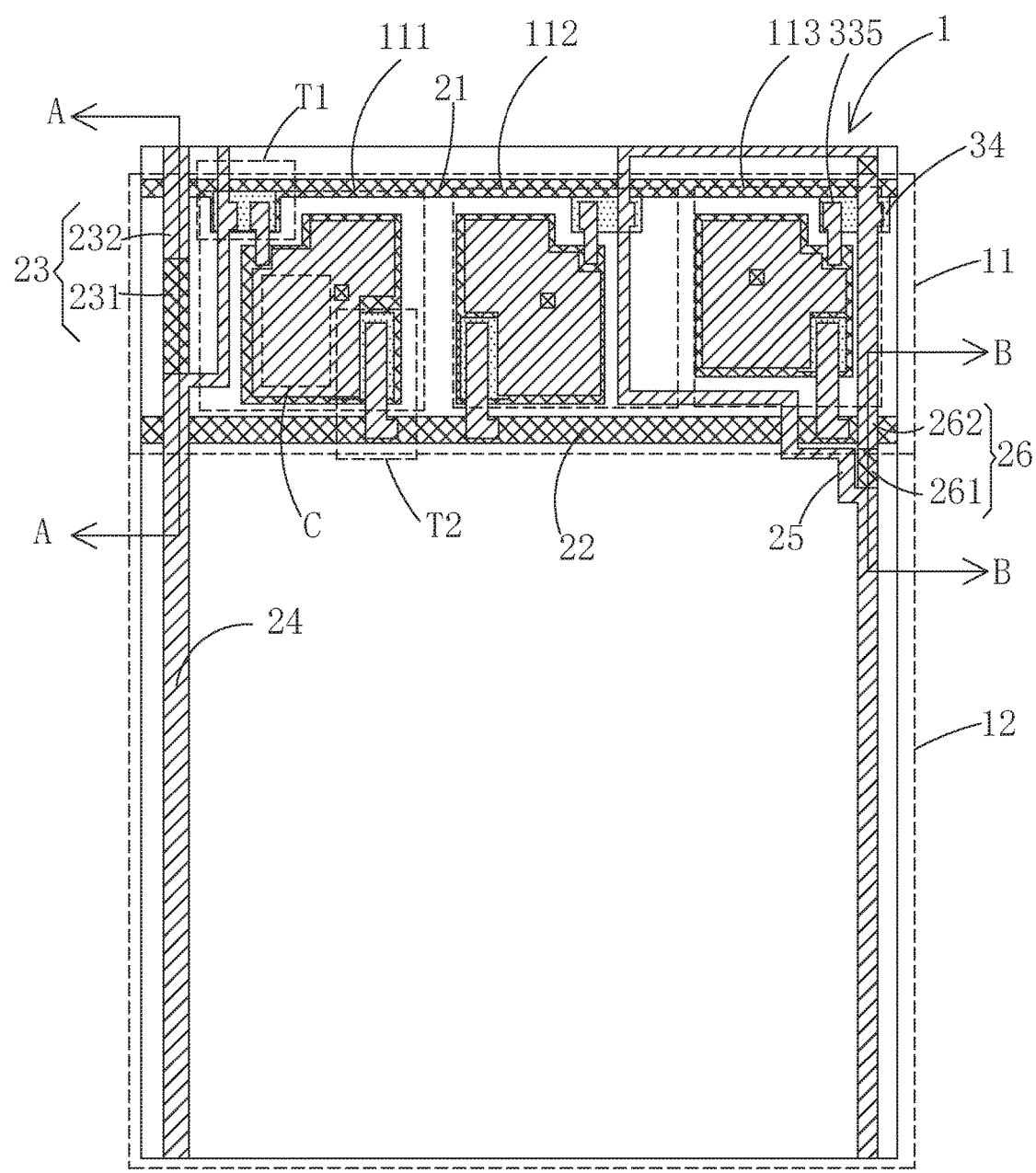
FIG. 2 is a schematic structural view of a transparent OLED display panel of the present application.
Figure 3:
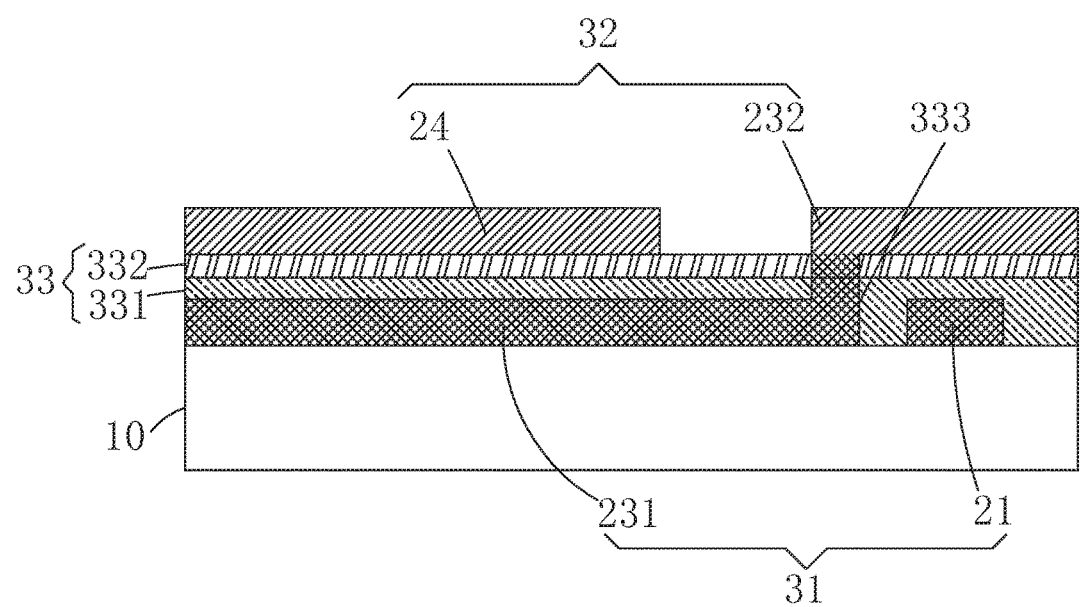
FIG. 3 is a cross-sectional view corresponding to the A-A site illustrated in FIG. 2.
Figure 4:
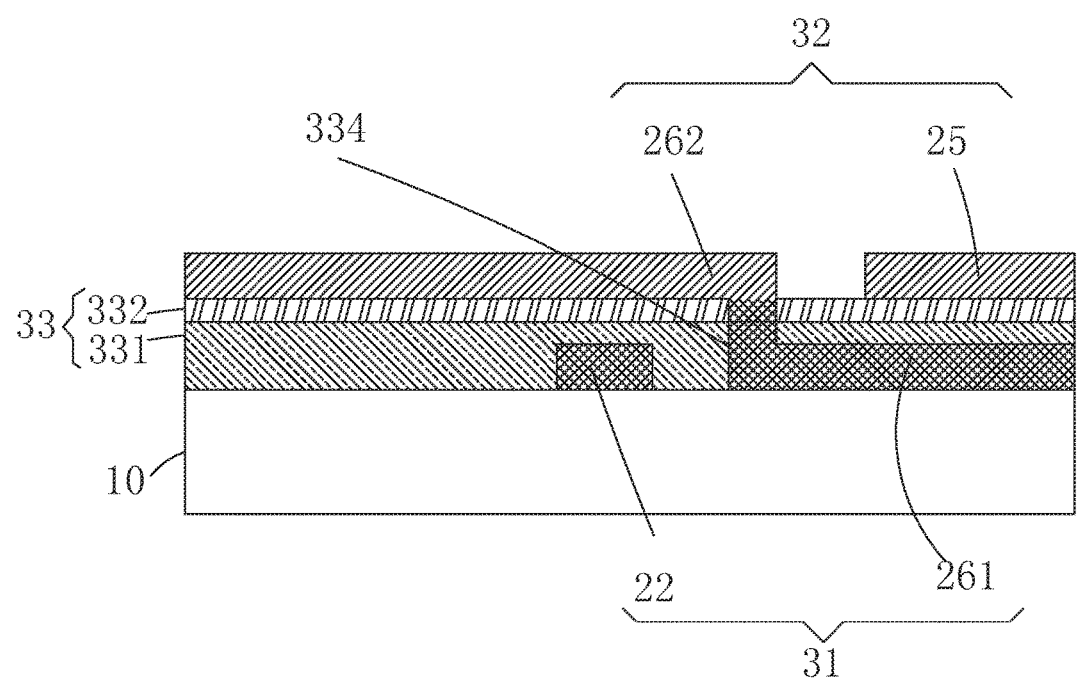
FIG. 4 is a cross-sectional view corresponding to the B-B site illustrated in FIG. 2.

Referring to FIG. 2, the present application provides a transparent OLED display panel including a plurality of display pixels 1 arranged in an array type, each of the plurality of display pixels 1 includes a display region 11 and a transparent region 12 sequentially arranged along a vertical direction, a first, a second, and a third sub-pixels 111, 112, and 113 are provided in each of the display region 11 and sequentially arranged along the horizontal direction.

Specifically, a horizontal scanning line 21 and a horizontal first power supply line 22 electrically connected to each row of the display pixel 1 is provided corresponding to each row of the display pixel 1, a vertical second power supply line 23 electrically connected to the first power supply line 22 is provided corresponding to each column of the display pixel 1, a first data line 24 electrically connected to the first sub-pixel 111 is provided corresponding to each column of the first sub-pixel 111, a second data line 25 electrically connected to the second sub-pixel 112 is provided corresponding to each column of the second sub-pixel 112, a third data line 26 electrically connected to the third sub-pixel 113 is provided corresponding to each column of the third sub-pixel 113;

The first power supply line 22 and the scanning line 21 are located in the first metal layer 31, and the first data line 24 and the second data line 25 are located in the second metal layer 32 stacked above the first metal layer 31, an insulating layer 33 is provided between the first metal layer 31 and the second metal layer 32;

The second power supply line 23 includes a first extension portion 231 and a first bridge portion 232, the first extension portion 231 is located in the first metal layer 31, the first bridge portion 232 is located in the second metal layer 32, the first bridge portion 232 is electrically connected to the first extension portion 231 through a first via hole 333 in the insulating layer 33, and the second power supply line 23 is insulated from and cross the scanning line 21 by the first bridge portion 232. The third data line 26 includes a second extension portion 261 and a second bridge portion 262, the second extension portion 261 is located in the first metal layer 31, the second bridge portion 262 is located in the second metal layer 32, the second bridge portion 262 is electrically connected to the second extension portion 261 through a second via hole 334 in the insulating layer 33, and the third data line 26 is insulated from and cross the first power supply line 22 by the second bridge portion 262 and the scanning line 21;

In the transparent region 12, the first data line 24 is insulated from and stacked arranged to the second power supply line 23, and the second data line 25 is insulated from and stacked arranged to the third data line 26.

Specifically, the plurality of the display pixels 1 arranged in the array type are disposed on a transparent substrate 10, the transparent substrate 10 is specifically selected from a glass substrate or a plastic substrate, the first, second, and third sub-pixels 111,112,113 are red, green, and blue sub-pixels, respectively.

Figure 5:
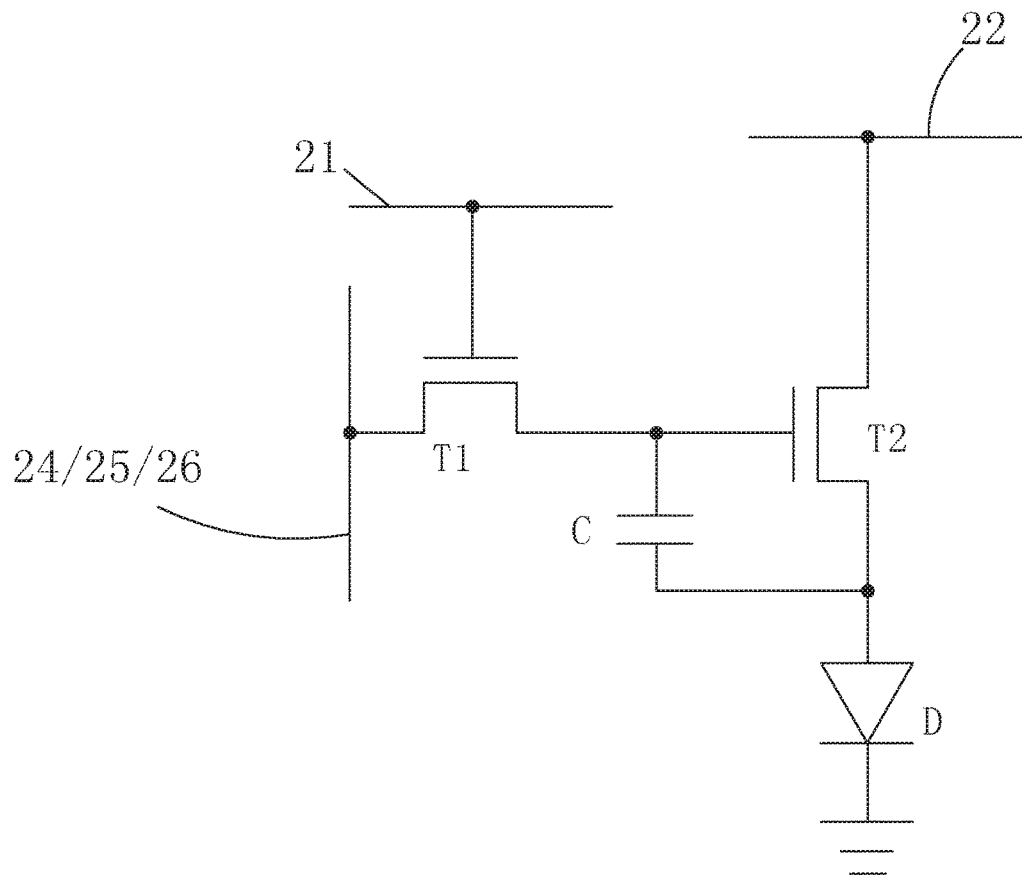
FIG. 5 is a circuit diagram of a sub-pixel of the transparent OLED display panel of the present application.

Further, referring to FIG. 5, each of the sub-pixels including the first, second, and third sub-pixels 111, 112, 113 is provided with a first thin film transistor T1, a second thin film transistor T2, a capacitor C, and an organic light emitting diode D;

Wherein the gate of the first thin film transistor T1 is electrically connected to the scanning line 21, the source is electrically connected to the data line corresponding to the sub-pixel, the drain is electrically connected to the gate of the second thin film transistor T2 and one end of the capacitor C; the drain of the second thin film transistor T2 is electrically connected to the first power supply line 22 corresponding to the sub-pixel, the source is electrically connected to the anode of the organic light emitting diode D; the anode of the organic light emitting diode D is electrically connected to the other end of the capacitive C, and the cathode is grounded.

Specifically, the gate of the first thin film transistor T1, the gate of the second thin film transistor T2, and the one end of the capacitor C are located in the first metal layer 31, the source and the drain of the first thin film transistor T1, the source and the drain of the second thin film transistor T2, and the other end of the capacitor C are located in the second metal layer 32, and the insulating layer 33 includes a gate insulating layer 331 and an interlayer insulating layer 332, the gate insulating layer 331 is provided with an active layer 34 at positions corresponding to the gate of the first thin film transistor T1 and the gate of the second thin film transistor T2, and the interlayer insulating layer 332 covers the active layer 34 and the gate insulating layer 331, the source and drain of the first thin film transistor T1 and the source and the drain of the second thin film transistor T2 are in contact with both ends of the corresponding active layer 34 through the two third via holes 335, respectively. Specifically, the third data line 26 is electrically connected to the source of the first thin film transistor T1 of the third sub-pixel 113 through the second bridge portion 262.

Further, a planarization layer, the anode of the organic light emitting diode D, the pixel definition layer, and the cathode of the organic light emitting diode D is stacking provided on the second metal layer 32 from the lower side to the upper side, a pixel defining groove is formed in the pixel defining layer, the anode of the organic light emitting diode D and the cathode of the organic light emitting diode D are formed on the upper and lower sides of the pixel defining groove, the organic light emitting layer of the organic light emitting diode D formed within the pixel defining groove, the anode of the organic light emitting diode D is electrically connected to the source of the second thin film transistor T2 and the one end of the capacitor C through the via in the planarization layer.

Specifically, the drain of the second thin film transistor T2 is electrically connected to the first power supply line 22 through a through hole penetrating the insulating layer 33, the drain of the first thin film transistor T1 is electrically connected to gate of the second thin film transistor T2 through a through hole penetrating the insulating layer 33.

It is to be noted that the gate of the first thin film transistor T1 acquires a scan control signal from the scanning line 21, the source of the first thin film transistor T1 acquires a data signal from the first data line 24 or the second data line 25 or the third data line 26, the gate of the second thin film transistor T2 acquires a data signal from the drain of the first thin film transistor T1, and the drain of the second thin film transistor T2 acquires a power supply signal from the first power supply line 22 to drive the organic light emitting diode D to emit light.

Preferably, the materials of the first metal layer 31 and the second metal layer 32 are both of one or combination of Aluminum, Molybdenum, and Titanium. The material of the insulating layer 33 is one or the combination of Silicon Oxide and Silicon Nitride.

Preferably, the first data line 24 and the second power supply line 23 are located on the left edge side of the display pixel 1, the second data line 25 and the third data line 26 are located on the right edge side of the display pixel 1, so that the central region of the transparent region 12 of the display pixel 1 no longer has any metal traces passed, greatly enhancing the transmittance of the transparent OLED display panel, and to facilitate the development of the high resolution transparent OLED display panel.

In view of the above, the present application provides a transparent OLED display panel in which a second power supply line and a first data line in the transparent region of the transparent OLED display panel are provided to the first metal layer and the second metal layer, respectively, so that the two layers are insulated and stacked. Simultaneously, the second data line and the third data line are also provided in the first metal layer and the second metal layer, respectively, so that the two layers are insulated and stacked, respectively, compared to the interval arrangement in the conventional technology, the area of the traces of the transparent region of the transparent OLED display panel can be greatly reduced, the transmittance of the transparent OLED display panel is enhanced and to facilitate the development of the high resolution transparent OLED display panel.

Above are embodiments of the present application, which does not limit the scope of the present application. Any modifications, equivalent replacements or improvements within the spirit and principles of the embodiment described above should be covered by the protected scope of the invention.

What is claimed is:

1. A transparent OLED display panel, comprising: a plurality of display pixels arranged in an array, each of the plurality of display pixels comprising a display region and a transparent region sequentially arranged in a vertical direction, each display region comprising a first, a second, and a third sub-pixels sequentially arranged in a horizontal direction;

wherein a horizontal scanning line and a horizontal first power supply line electrically connected to a row of the display pixels are provided corresponding to each row of the display pixels, a vertical second power supply line electrically connected to the horizontal first power supply line is provided corresponding to each column of the display pixels, a first data line electrically connected to the first sub-pixel is provided corresponding to each column of the first sub-pixel, a second data line electrically connected to the second sub-pixel is provided corresponding to each column of the second sub-pixel, a third data line electrically connected to the third sub-pixel is provided corresponding to each column of the third sub-pixel;

the horizontal first power supply line and the horizontal scanning line are located in a first metal layer, the first data line and the second data line are located in a second metal layer stacked above the first metal layer, an insulating layer is provided between the first metal layer and the second metal layer;

the vertical second power supply line comprises: a first extension portion and a first bridge portion, the first extension portion is located in the first metal layer, the first bridge portion is located in the second metal layer, the first bridge portion is electrically connected to the first extension portion through a first via hole in the insulating layer, and the vertical second power supply line is insulated from and cross the horizontal scanning line by the first bridge portion; the third data line comprising a second extension portion and a second bridge portion, the second extension portion is located in the first metal layer, the second bridge portion is located in the second metal layer, the second bridge portion is electrically connected to the second extension portion through a second via hole in the insulating layer, and the third data line is insulated from and cross the horizontal first power supply line by the second bridge portion and the horizontal scanning line; and in the transparent region, the first data line is insulated and stacked to the vertical second power supply line, and the second data line is insulated and stacked to the third data line.

2. The transparent OLED display panel according to claim 1, wherein the first, second, and third sub-pixels are red, green, and blue sub-pixels, respectively.

3. The transparent OLED display panel according to claim 1, wherein each one of the first, second, and third sub-pixels comprises a first thin film transistor having a gate, a source, and a drain, a second thin film transistor having a gate, a source, and a drain, a capacitor having a first end and an opposite second end, and an organic light emitting diode;

wherein the gate of the first thin film transistor is electrically connected to the scanning line, the source of the first thin film transistor is electrically connected to the data line corresponding to said one of the first, second, and third sub-pixels, the drain of the first thin film transistor is electrically connected to the gate of the second thin film transistor and the first end of the capacitor; the drain of the second thin film transistor is electrically connected to the horizontal first power supply line corresponding to said one of the first, second, and third sub-pixels, the source of the second thin film transistor is electrically connected to an anode of the organic light emitting diode; the anode of the organic light emitting diode is electrically connected to the second end of the capacitor, and a cathode of the organic light emitting diode is grounded.

4. The transparent OLED display panel according to claim 3, wherein the gate of the first thin film transistor, the gate of the second thin film transistor, and the first end of the capacitor are located in the first metal layer, the source and the drain of the first thin film transistor, the source and the drain of the second thin film transistor, and the second end of the capacitor are located in the second metal layer.

5. The transparent OLED display panel according to claim 4, wherein the insulating layer comprises a gate insulating layer and an interlayer insulating layer; and an active layer is provided on the gate insulating layer corresponding, in position, to the gate of the first thin film transistor and the gate of the second thin film transistor, and the interlayer insulating layer covers the active layer and the gate insulating layer.

6. The transparent OLED display panel according to claim 5, wherein the source and drain of the first thin film transistor and the source and the drain of the second thin film transistor are in contact with two ends of the active layer through two third via holes, respectively.

7. The transparent OLED display panel according to claim 1, wherein materials of the first metal layer and the second metal layer are both one of Aluminum, Molybdenum, and Titanium, or a combination thereof.

8. The transparent OLED display panel according to claim 1, wherein a material of the insulating layer is one of Silicon Oxide and Silicon Nitride, or a combination thereof.

9. The transparent OLED display panel according to claim 1, wherein the first data line and the vertical second power supply line are located on a left edge side of the display pixel, the second data line and the third data line are located on a right edge side of the display pixel.

10. A transparent OLED display panel, comprising: a plurality of display pixels arranged in an array, each of the plurality of display pixels comprising a display region and a transparent region sequentially arranged in a vertical direction, each display region comprising a first, a second, and a third sub-pixels sequentially arranged in a horizontal direction;
- wherein a horizontal scanning line and a horizontal first power supply line electrically connected to a row of the display pixels are provided corresponding to each row of the display pixels, a vertical second power supply line electrically connected to the horizontal first power supply line is provided corresponding to each column of the display pixels, a first data line electrically connected to the first sub-pixel is provided corresponding to each column of the first sub-pixel, a second data line electrically connected to the second sub-pixel is provided corresponding to each column of the second sub-pixel, a third data line electrically connected to the third sub-pixel is provided corresponding to each column of the third sub-pixel;
- the horizontal first power supply line and the horizontal scanning line are located in a first metal layer, the first data line and the second data line are located in a second metal layer stacked above the first metal layer, an insulating layer is provided between the first metal layer and the second metal layer;
- the vertical second power supply line comprises: a first extension portion and a first bridge portion, the first extension portion is located in the first metal layer, the first bridge portion is located in the second metal layer, the first bridge portion is electrically connected to the first extension portion through a first via hole in the insulating layer, and the vertical second power supply line is insulated from and cross the horizontal scanning line by the first bridge portion; the third data line comprising a second extension portion and a second bridge portion, the second extension portion is located in the first metal layer, the second bridge portion is located in the second metal layer, the second bridge portion is electrically connected to the second extension portion through a second via hole in the insulating layer, and the third data line is insulated from and cross the horizontal first power supply line by the second bridge portion and the horizontal scanning line;
- in the transparent region, the first data line is insulated and stacked to the vertical second power supply line, and the second data line is insulated and stacked to the third data line;
- wherein the first, second, and third sub-pixels are red, green, and blue sub-pixels, respectively;
- wherein each one of the first, second, and third sub-pixels comprises a first thin film transistor having a gate, a source, and a drain, a second thin film transistor having a gate, a source, and a drain, a capacitor having a first end and an opposite second end, and an organic light emitting diode;
- wherein the gate of the first thin film transistor is electrically connected to the scanning line, the source of the first thin film transistor is electrically connected to the data line corresponding to said one of the first, second, and third sub-pixels, the drain of the first thin film transistor is electrically connected to the gate of the second thin film transistor and the first end of the capacitor; the drain of the second thin film transistor is electrically connected to the horizontal first power supply line corresponding to said one of the first, second, and third sub-pixels, the source of the second thin film transistor is electrically connected to an anode of the organic light emitting diode; the anode of the organic light emitting diode is electrically connected to the second end of the capacitor, and a cathode of the organic light emitting diode is grounded.

11. The transparent OLED display panel according to claim 10, wherein the gate of the first thin film transistor, the gate of the second thin film transistor, and the first end of the capacitor are located in the first metal layer, the source and the drain of the first thin film transistor, the source and the drain of the second thin film transistor, and the second end of the capacitor are located in the second metal layer.

12. The transparent OLED display panel according to claim 11, wherein the insulating layer comprises a gate insulating layer and an interlayer insulating layer; and
- an active layer is provided on the gate insulating layer corresponding, in position, to the gate of the first thin film transistor and the gate of the second thin film transistor, and the interlayer insulating layer covers the active layer and the gate insulating layer.

13. The transparent OLED display panel according to claim 12, wherein the source and drain of the first thin film transistor and the source and the drain of the second thin film transistor are in contact with two ends of the active layer through two third via holes, respectively.

14. The transparent OLED display panel according to claim 10, wherein materials of the first metal layer and the second metal layer are both one of Aluminum, Molybdenum, and Titanium, or a combination thereof.

15. The transparent OLED display panel according to claim 10, wherein a material of the insulating layer is one of Silicon Oxide and Silicon Nitride, or a combination thereof.

16. The transparent OLED display panel according to claim 10, wherein the first data line and the vertical second power supply line are located on a left edge side of the display pixel, the second data line and the third data line are located on a right edge side of the display pixel.

* * * * *